United States Patent [19]
Kim

[11] Patent Number: 5,861,731
[45] Date of Patent: Jan. 19, 1999

[54] DEVICE AND METHOD FOR DETECTING AND DISPLAYING CHARGE CAPACITY OF A BATTERY

[75] Inventor: Dong-Ho Kim, Taebaek, Rep. of Korea

[73] Assignee: SamSung Electronics Co., Ltd., Kyungki-do, Rep. of Korea

[21] Appl. No.: 882,602

[22] Filed: Jun. 25, 1997

[30] Foreign Application Priority Data

Jun. 25, 1996 [KR] Rep. of Korea ................... 1996 23581

[51] Int. Cl.$^6$ .......................... H01M 10/44; H01M 10/46
[52] U.S. Cl. ................................. 320/132; 320/DIG. 21
[58] Field of Search ................................. 320/116, 118, 320/127, 132, 134, 135, 136, 147, DIG. 18, DIG. 21; 324/427, 428; 340/635, 636; 429/61, 90

[56] References Cited

U.S. PATENT DOCUMENTS

| | | |
|---|---|---|
| 3,944,905 | 3/1976 | Allport et al. . |
| 4,019,112 | 4/1977 | Satoh . |
| 4,020,414 | 4/1977 | Paredes . |
| 4,027,231 | 5/1977 | Lohrmann . |
| 4,163,186 | 7/1979 | Haley . |
| 4,258,306 | 3/1981 | Bourke et al. . |
| 4,318,092 | 3/1982 | Cowles et al. . |
| 4,321,543 | 3/1982 | Tuska . |
| 4,365,236 | 12/1982 | Maida .............................. 340/347 AD |
| 4,521,735 | 6/1985 | Kageyama et al. ..................... 324/433 |
| 4,876,632 | 10/1989 | Osterhout et al. . |
| 5,126,675 | 6/1992 | Yang . |
| 5,298,850 | 3/1994 | Matsui ............................... 324/428 X |
| 5,498,932 | 3/1996 | Shin et al. . |

*Primary Examiner*—Edward H. Tso
*Attorney, Agent, or Firm*—Robert E. Bushnell, Esq.

[57] ABSTRACT

A battery capacity indicating device includes a plurality of switching parts connected in parallel to a battery, each of which outputs a controlling signal corresponding to a predetermined voltage range when a voltage across the battery terminals falls within the predetermined voltage range, with at least one of the predetermined voltage ranges having finite upper and lower limits; a controlling part for receiving the output controlling signal among other controlling signals and generating from the received controlling signals a displaying signal corresponding to a display range into which the voltage falls; and a displaying part for generating a display indication representative of the display range. A battery capacity indicating method is provided wherein the displaying signals corresponding to the controlling signals are output when they are applied.

20 Claims, 3 Drawing Sheets

DEVICE AND METHOD FOR DETECTING AND DISPLAYING CHARGE CAPACITY OF A BATTERY

CLAIM OF PRIORITY

This application makes reference to, incorporates the same herein, and claims all benefits accruing under 35 U.S.C. §119 from an application for DEVICE AND METHOD FOR DISPLAYING CAPACITANCE OF A BATTERY earlier filed in the Korean Industrial Property Office on the 25th day of Jun. 1996 and there duly assigned Ser. No. 23581/1996, a copy of which application is annexed hereto.

BACKGROUND OF THE INVENTION

1. Field of the Invention

The present invention relates to a battery and, more particularly, to a device and method for determining the charge capacity of a battery within predetermined quantitative ranges and displaying the determined value using 7-segment light emitting diode (LED) display modules.

2. Description of the Related Art

A typical device for indicating the capacity (or voltage) of a battery displays one or two colored LEDs to indicate the charge status (i.e., voltage level) of the battery. With such a device a user cannot know the present capacity of the battery. Accordingly, the user cannot accurately anticipate when the battery will become exhausted or, if the battery is being charged, estimate the time required to fully charge it.

Various approaches have been proposed to address the problem of providing a quantitative indication of the existing charge in a battery. For example, U.S. Pat. No. 4,020,414 shows a device with a plurality of comparators and an indicator connected to the output of each comparator. The comparators indicate the battery voltage level relative to different reference levels, and thus the device provides an indication of the battery's remaining charge. But the design of this system may require relatively expensive integrated circuits to implement and does not allow easy modification to enhance existing functions or to add new ones.

U.S. Pat. No. 5,126,675, on the other hand, proposes an alternative solution using diodes and LEDs. The disclosed system here does not involve sophisticated comparator circuitry and still provides a quantitative indication of remaining battery capacity. On the other hand, it requires a large number of discrete components in an arrangement that makes modification or addition of functions awkward. This circuit also measures battery voltage by an indirect method (equivalent internal resistance) and generates an analog indicating output signal not easily adapted to digital display means.

I have therefore found that a need exists for an improved battery charge indicating device and method. Such an invention would provide a quantitative indication of remaining charge in a battery but would have a flexible design readily adaptable to improvement of and addition to its functional capabilities without requiring expensive and delicate integrated components. This system would also include detection means with output readily amenable to digital processing and would provide a flexible and easily-read display means. It also desirably would allow implementation with inexpensive, standard components or in configurations suitable for harsh or unusual use environments.

SUMMARY OF THE INVENTION

Accordingly, an object of the present invention is to provide a device and method which displays the capacity of a battery by quantitative stages.

Another object of the present invention is to provide such a device and method producing a flexible digital output from which the indication of battery charge is generated by a display means.

A further object of the present invention is to provide such a device and method capable of implementation using inexpensive components but easily adaptable to provide enhanced or additional functions.

To accomplish these and other objects, the present invention in a first aspect provides a device comprising a plurality of switching parts, a controlling part in communication with each of the switching parts, and a displaying part in communication with the controlling part. A predetermined voltage range corresponds to each of the switching parts. Each of the switching parts is adapted to be connected in parallel with every other one of the switching parts to a first terminal of a battery. Each is further adapted to generate a controlling signal corresponding to it when a voltage existing across the first terminal and a second terminal of the battery is within the predetermined voltage range that corresponds to it. At least one of the switching parts has a corresponding predetermined voltage range that has finite predetermined upper and lower limits.

The controlling part is adapted to receive a plurality of controlling signals that includes the controlling signals generated by the switching parts. It is further adapted to generate from one or more received controlling signals a display signal representative of one of a plurality of display ranges, with that display range corresponding to a voltage range that includes the voltage across the battery terminals. The displaying part is adapted to receive the displaying signal and to generate from it a display indication representative of the display range.

A second aspect of the present invention provides a method of indicating battery capacity that comprises the step of generating a first controlling signal corresponding to one of a plurality of predetermined voltage ranges when a voltage existing across first and second terminals of a battery is within the predetermined voltage range. At least one of the predetermined voltage ranges has finite upper and lower limits. The method includes a further step of receiving one or more controlling signals that include the first control signal and generating from the received control signals a displaying signal representative of one of a plurality of display ranges. The display range represented by the display signal corresponds to a voltage range that includes the voltage across the battery terminals. The method also includes the step of generating from the displaying signal a display indication representative of the display range.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT(S)

Figure 1:
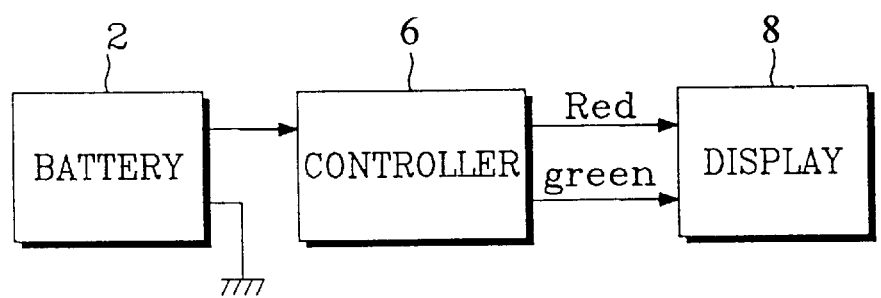
FIG. 1 provides a block diagram of a conventional device for displaying the capacity of a battery.

FIG. 1 is a block diagram of a conventional device for displaying the capacity of a battery 2. In summary, the system of FIG. 1 operates through a controlling part 4 that checks the capacity of battery 2 and outputs a green controlling signal if it is fully charged, or a red controlling signal if not.

A displaying part 6 receives the green controlling signal and in response thereto displays a green signal. Similarly, in response to the red controlling signal, displaying part 6 displays a red signal. By reference to the displayed signal, either green or red, a user can check the capacity of battery 2.

The following discussion will describe a preferred embodiment of the present invention in detail with reference to the attached drawing figures. It should be noted that, insofar as is possible, like numerals in the figures designate like components.

Figure 2:
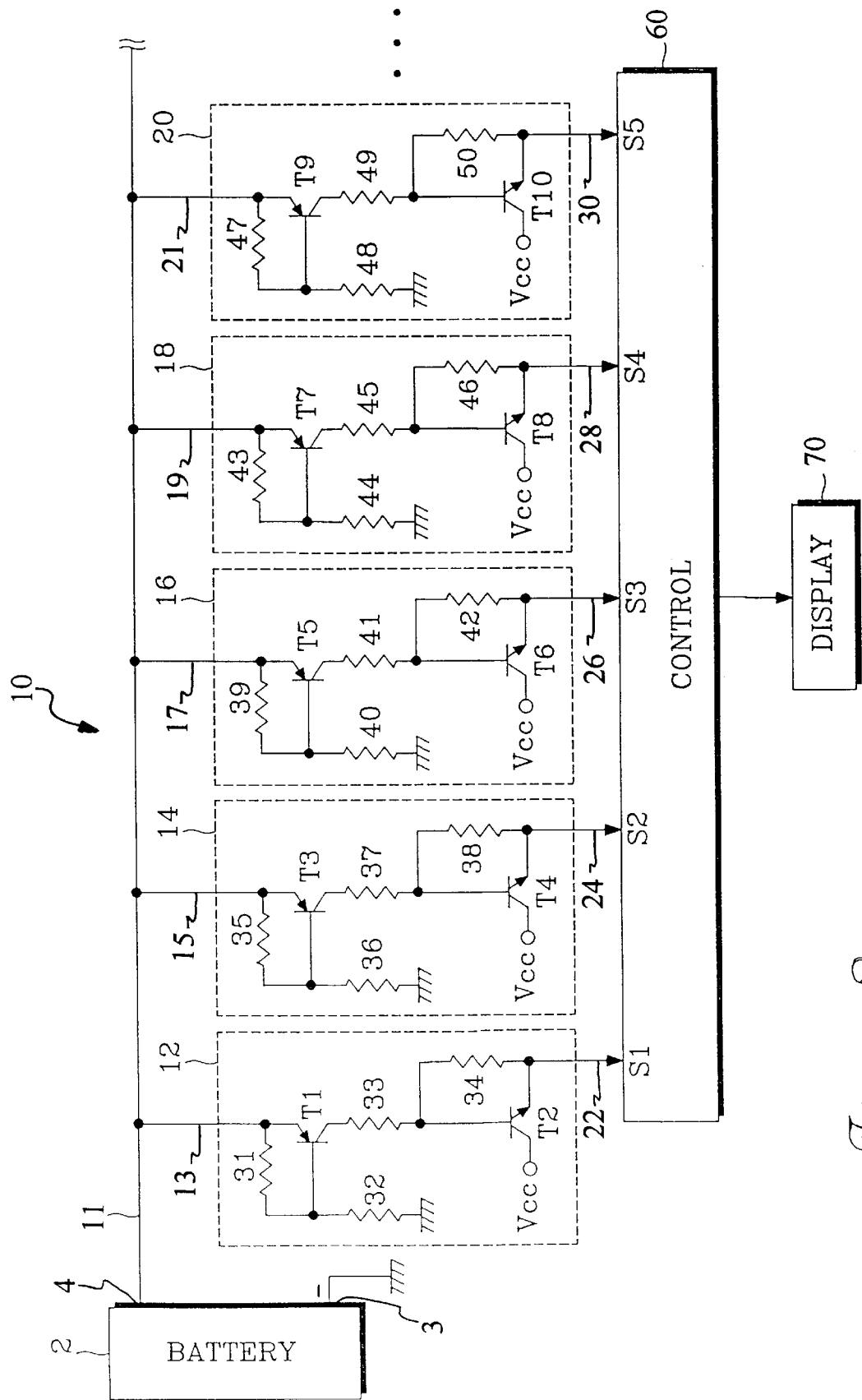
FIG. 2 provides a block diagram of a device for displaying the capacity of a battery according to a preferred embodiment of the present invention.

FIG. 2 shows a particular apparatus 10 embodying one aspect of the present invention. Battery 2 has a negative terminal 3, connected to ground, and a positive terminal 4. A line 11 connects positive terminal 4 of battery 2 to a first switching part 12 at an input side 13 thereof. A second switching part 14 connects at input side 15 to line 11 in parallel with first switching part 12, and similarly a third switching part 16 at input side 17, a fourth switching part 18 at input side 19, and a fifth switching part at input side 21 all connect in parallel to line 11. First through fifth switching parts 12, 14, 16, 18, and 20 also have first through fifth output sides 22, 24, 26, 28, and 30, respectively, which will be discussed below.

First, though, the internal structure and operation of switching parts 12–20 will be described. In this and the following discussion, apparatus 10 will be discussed in the context of a particular example. It should be noted, however, that the details of this example are not intended to present a limiting definition of the present invention. In this exemplary case, the full capacity of battery 2 is presumed to be 6V and the actual capacity of battery 2 is measured in terms of six voltage levels of 1V each.

The internal construction of switching parts 12–20 allow them to detect a voltage difference between positive terminal 4 and negative terminal 3 within an appropriate one of these voltage levels. First switching part 212 includes a PNP transistor T1, an NPN transistor T2 coupled to transistor T1, and resistors 31, 32, 33, and 34 selected so that switching part 12 turns on when the voltage difference is between 1V and 5V. When the actual capacity of battery 2 provides a voltage difference in the range 1V–5V, transistor T1 and transistor T2 are both turned on. A path for power voltage Vcc is thereby completed, and a first controlling signal S1 is output from first switching part 12 at first output side 22.

In a similar manner, second switching part 14 includes PNP transistor T3, NPN transistor T4 coupled to transistor T3, and resistors 35, 36, 37, 38. Resistors 35, 36, 37, and 38, in turn, are chosen so that when battery 2 has a voltage of between 2V and 5V, second switching part 14 turns on. In particular, when the voltage difference is in the range 2V–5V, transistor T3 is turned on and transistor T4 is turned on, which completes a path for power voltage Vcc. Thus, under this battery voltage condition, second switching part 14 turns on and outputs from second output side 24 a second controlling signal S2.

Third and fourth switching parts 16 and 18 are constructed similarly to provide detection for the voltage ranges 3–5V and 4–5V, respectively. Third switching part 16 includes PNP transistor T5 which is coupled to NPN transistor T6, and resistors 39, 40, 41, and 42 selected to turn on transistor T5 and transistor T6 when the voltage difference is between 3V and 5V. Fourth switching part 18 includes PNP transistor T7, which is coupled to NPN transistor T8, and resistors 43, 44, 45, and 46 selected to turn on transistor T7 and transistor T8 when the voltage difference is between 4V and 5V. A third controlling signal S3 is output from third output side 26 when third switching part 16 is turned on, and a fourth controlling signal S4 is output from fourth output side 28 when fourth switching part 18 is turned on.

Fifth switching part 20 includes PNP transistor T9, NPN transistor T10, and resistors 47, 48, 49, and 50 and provides detection of voltages in the range above 5V. Transistor T10 is coupled to transistor T9, and resistors 47, 48, 49, and 50 are selected to turn on both transistors T9 and T10 when the voltage difference exceeds 5V. When battery 2 has a voltage at such a level, fifth switching part outputs fifth controlling signal S5 at fifth output side 30.

First through fifth switching parts 12, 14, 16, 18, and 20 connect at their respective output sides 22, 24, 26, 28, and 30 to a controlling part 60. Controlling part 60, in turn, is coupled to and provides first through sixth displaying signals to a displaying part 70 that includes several seven-segment LED modules for displaying numerals corresponding to the displaying signals.

Figure 3:
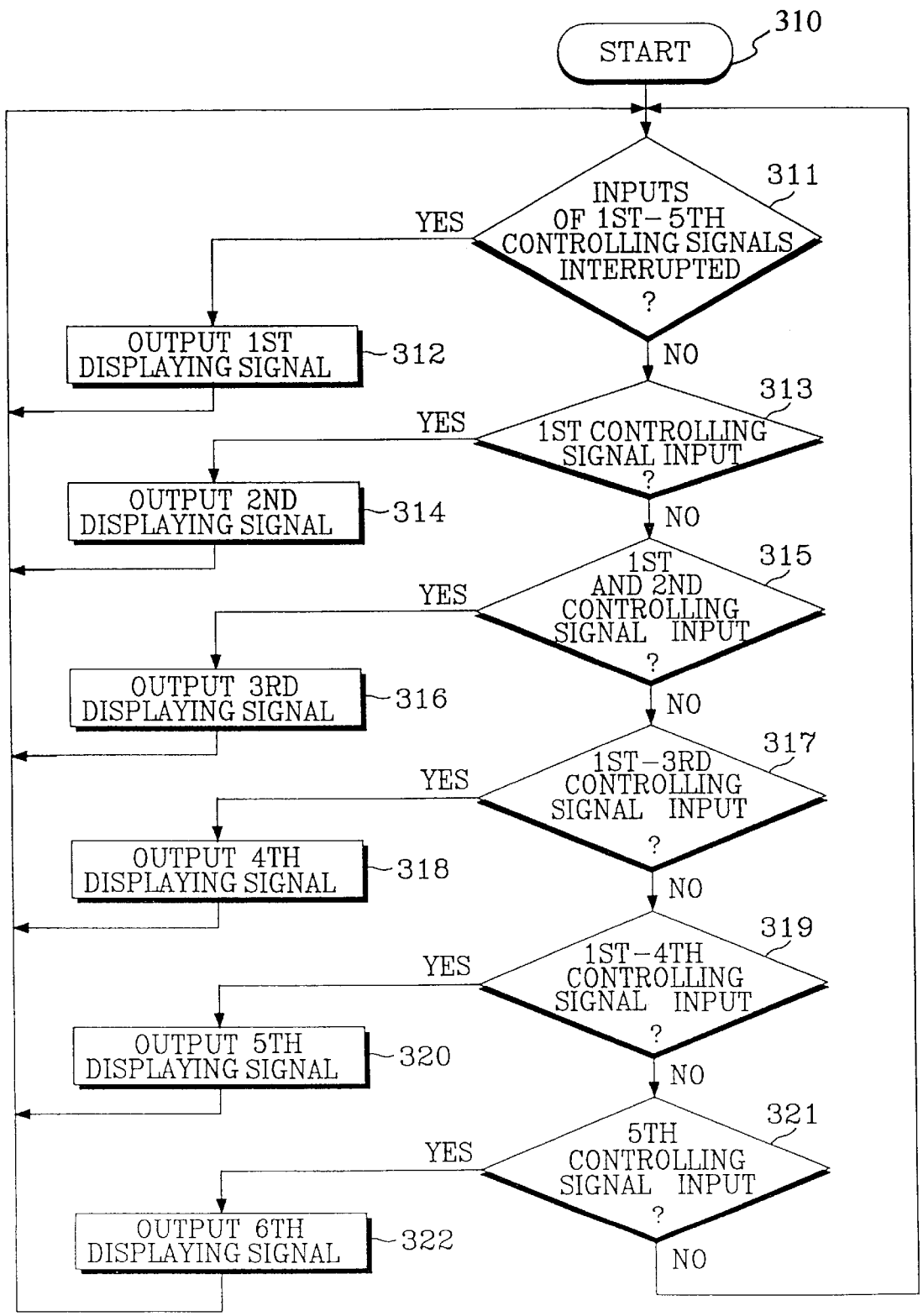
FIG. 3 is a flow diagram illustrating a method for displaying the capacity of a battery in accordance with the principles of the present invention.

FIG. 3 shows a flow diagram of an exemplary method according to a second aspect of the present invention and illustrative of the operation of apparatus 10 shown in FIG. 2. In the following discussion, the control procedure executed by controlling part 60, to which first to fifth controlling signals S1–S5 are input, is described with reference to FIGS. 2 and 3.

The procedure shown in FIG. 3 begins with a start step 310. Controlling part 60 determines at step 311 whether it has received any of first through fifth controlling signals S1–S5. It may occur that none of these signals has been input from first to fifth switching parts 12–20. In this case, controlling part 60 outputs at step 312 a first displaying signal to displaying part 70 representative of a capacity of battery 2 corresponding to a voltage between 0V and 1V. In response to this first displaying signal, displaying part 70 displays the numeral 0 corresponding to the voltage range 0–1V.

If controlling part 60 detects receipt of a controlling signal at step 311, on the other hand, then at step 313 it determines whether the input signals consist of first controlling signal S1 and no others. If so, then at step 314 controlling part 60 outputs to displaying part 70 a second displaying signal representative of a capacity of battery 2 corresponding to a voltage between 1V and 2V. In response to this second displaying signal, displaying part 70 displays the numeral 20 corresponding to the voltage range 1–2V. If not, then flow proceeds to step 315 where controlling part 60 determines in a similar manner whether the input signals consist of first and second controlling signals S1 and S2 and no others.

If at step 315 controlling part 60 detects only controlling signals S1 and S2, then at step 316 it outputs to displaying part 70 a third displaying signal representing the case where the capacity of battery 2 corresponds to a voltage in the range 2–3V. Displaying part 70 responds to the third displaying signal by displaying the numeral 40. The flow proceeds to step 317 if more than controlling signals S1 and S2 are detected at step 315, in which case controlling part 60 determines whether the detected controlling signals consist of first, second, and third controlling signals S1, S2, and S3 only.

If first, second, and third controlling signals S1–S3 are detected at step 317, but no others are detected, then at step 318 controlling part 60 outputs a fourth displaying signal representing the case where the capacity of battery 2 corresponds to a voltage between 3V and 4V. Displaying part 70 responds to the fourth displaying signal by displaying the numeral 60. If more than controlling signals S1–S3 are detected, then the flow proceeds to step 319 where controlling part 60 determines whether it has received only the first through fourth controlling signals S1–S4.

When at step 319 controlling part 60 detects all of the first to fourth controlling signals S1–S4, then at step 320 controlling part 60 outputs a fifth displaying signal representing the case where the capacity of battery 2 is between 4V and 5V. Displaying part 70 responds to the fifth displaying signal by displaying the numeral 80.

If controlling part 60 does not detect controlling signals S1–S4 at step 319, then by the process of elimination the controlling signal detected at step 311 must have been the fifth controlling signal S5. Controlling part 60 confirms this fact at step 321 and, upon confirmation, outputs a sixth displaying signal at step 322 that represents the case where the capacity of battery 2 corresponds to a voltage between 5V and 6V. Displaying part 70 responds to this sixth displaying signal by displaying the numeral 100. If the determination at step 321 is negative, the flow returns to step 311. The flow also returns to step 311 from output steps 312, 314, 316, 318, 320, and 322.

Table 1 summarizes the above procedure:

TABLE 1

| Capacity of battery (Vbat) | Control Signal | Data displayed |
| --- | --- | --- |
| $0 \leq$ Vbat $< -1$ | — | 0 |
| $1 \leq$ Vbat $< 2$ | S1 | 20 |
| $2 \leq$ Vbat $< 3$ | S1–S2 | 40 |
| $3 \leq$ Vbat $< 4$ | S1–S3 | 60 |
| $4 \leq$ Vbat $< 5$ | S1–S4 | 80 |
| $5 \leq$ Vbat $< 6$ | S5 | 100 |

As described above, by displaying the capacity (i.e., the voltage) of battery 2 in terms of several charge levels, the present invention provides the advantage that a user can predict the approximate time remaining in a charging operation until battery 2 is fully charged. Alternatively, the present invention allows the user to predict the remaining time until battery 2 becomes fully discharged, which facilitates preparation for replacing or recharging battery 2. Moreover, the present invention provides these functions in the context of a user-friendly display feature and a simple, inexpensive, but flexible design.

It should be understood that the present invention is not limited to the particular embodiment disclosed herein as the best mode contemplated for carrying out the invention. Similarly, the present invention is not limited to any of the specific embodiments described in this specification, except as defined in the appended claims.

What is claimed is:

1. A battery capacity indicating device, comprising:
    a plurality of switching parts, wherein each one of said plurality of switching parts has corresponding thereto a predetermined voltage range and is adapted to be connected in parallel with every other one of said plurality of switching parts to a first terminal of a battery and
    to generate a controlling signal corresponding to said switching part when a voltage existing across said first terminal and a second terminal of said battery is within said predetermined voltage range,
    with at least one of said plurality of switching parts having corresponding thereto as said predetermined voltage range a voltage range having a finite predetermined upper limit and a finite predetermined lower limit;
    a controlling part in communication with each one of said plurality of switching parts and adapted
        to receive a plurality of controlling signals and
        to generate from one or more received ones of said plurality of controlling signals a displaying signal representative of one of a plurality of display ranges,
    with said plurality of controlling signals including for each one of said plurality of switching parts said controlling signal corresponding to said switching part and with said display range corresponding to a voltage range including said voltage; and
    a displaying part in communication with said controlling part and adapted to receive said displaying signal and to generate therefrom a display indication representative of said display range.

2. The device of claim 1, wherein each one of said plurality of switching parts generates said controlling signal by turning on when said voltage is within said predetermined voltage range.

3. The device of claim 1, wherein each one of said plurality of display ranges corresponds to said predetermined voltage range corresponding to one of said plurality of switching parts.

4. The device of claim 1, wherein said first terminal is a positive terminal of said battery.

5. The device of claim 4, wherein said second terminal is a negative terminal of said battery.

6. The device of claim 1, wherein at least one of said plurality of switching parts includes:
    a first voltage divider;
    a second voltage divider;
    a first transistor having a base connected to said first voltage divider; and
    a second transistor having a base connected to said second voltage divider;
    with said first voltage divider and said first transistor adapted to turn on said first transistor when said voltage is not below a first predetermined level and with said second voltage divider and said second transistor adapted for said second transistor to turn on when said voltage is not above a second predetermined level.

7. The device of claim 1, wherein said displaying part includes a plurality of seven-segment LED modules and said display indication includes one or more numerals displayed by said plurality of seven-segment LED modules, with said one or more numerals representative of said display range.

8. A method of indicating battery capacity using a plurality of switches connected in parallel with a battery, comprising the steps of:
    generating a first controlling signal, from one of said plurality of switches each comprised of complementary voltage dividers and transistors operable when a voltage existing across a first terminal and a second terminal of a battery is within a predetermined voltage range, corresponding to one of a plurality of predetermined voltage ranges, with at least one of said plurality of predetermined voltage ranges having a finite upper limit and a finite lower limit;
    generating therefrom a displaying signal representative of one of a plurality of display ranges in response to said first controlling signal with said display range corresponding to a voltage range including said voltage existing across said first terminal and said second terminal of said battery; and providing a visual indication representative of said display range in response to said displaying signal.

9. The method of claim 8, wherein said one of said plurality of switches generates said first controlling signal by turning on in response to said voltage, and adapted to be connected to said first terminal of said battery in parallel with every other one of said plurality of switches and to turn on in response to a terminal-to-terminal voltage of said battery falling within said predetermined voltage range.

10. The method of claim 8, wherein each one of said plurality of display ranges corresponds to one of said plurality of predetermined voltage ranges.

11. The method of claim 8, wherein said first terminal is a positive terminal of said battery.

12. The method of claim 11, wherein said second terminal is a negative terminal of said battery.

13. The method of claim 8, wherein said display indication includes one or more numerals.

14. The method of claim 13, where in said display indication is generated by a displaying part including one or more seven-segment LED modules and said one or more numerals are displayed by said one or more seven-segment LED modules.

15. A battery capacity indicating device for determining a charge capacity of a battery, comprising:

a plurality of switches each operable in a corresponding voltage range and connected in parallel to one terminal of a battery for generating a respective control signal, when a battery voltage across both terminals of the battery is within said corresponding voltage range, each of said plurality of switches comprising:

a first transistor having a first electrode of a principle electrically conducting channel connected to said one terminal of the battery, a second electrode of said principle electrically conducting channel connected to a node, and a control electrode connected to a voltage divider; and a second transistor having a first electrode of a principle electrically conducting channel connected to a power terminal, a second electrode of said principle electrically conducting channel connected to an output terminal providing said respective control signal, and a control electrode connected to said node;

a display unit for providing a variable visual display of the charge capacity of the battery in different discrete voltage levels; and a controller connected to said plurality of switches and said display unit, for controlling the variable visual display of the charge capacity of the battery in different discrete voltage levels in response to the respective control signals from the switches.

16. The battery capacity indicating device of claim 15, further comprised of said display unit comprising a plurality of seven-segment LED modules for providing said variable visual display of the charge capacity of the battery in different discrete voltage levels from one to six volts.

17. A battery capacity indicating device for determining a charge capacity of a battery, comprising:

a first transistor switch operable in a first voltage range and connected in parallel to a terminal of a battery for generating a first control signal, when a battery voltage across both terminals of the battery is within said first voltage range;

a second transistor switch operable in a second voltage range and connected in parallel to said terminal of the battery for generating a second control signal, when the battery voltage across both terminals of the battery is within said second voltage range;

a third transistor switch operable in a third voltage range and connected in parallel to said terminal of the battery for generating a third control signal, when the battery voltage across both terminals of the battery is within said third voltage range;

a fourth transistor switch operable in a fourth voltage range and connected in parallel to said terminal of the battery for generating a fourth control signal, when the battery voltage across both terminals of the battery is within said fourth voltage range;

a fifth transistor switch operable in a fifth voltage range and connected in parallel to said terminal of the battery for generating a fifth control signal, when the battery voltage across both terminals of the battery is within said fifth voltage range;

a display unit for providing a variable visual display of the charge capacity of the battery in different discrete voltage levels corresponding to each of first, second, third, fourth, and fifth voltage ranges; and a controller connected to said plurality of switches and said display unit, for controlling the variable visual display of the charge capacity of the battery in different discrete voltage levels in response to each of the first, second, third, fourth, and fifth control signals.

18. The battery capacity indicating device of claim 17, further comprised of each of said first, second, third, fourth, and fifth transistor switches comprising:

a first transistor having a first electrode of a principle electrically conducting channel connected to said terminal of the battery, a second electrode of said principle electrically conducting channel connected to a node, and a control electrode connected to a voltage divider; and a second transistor having a first electrode of a principle electrically conducting channel connected to a power terminal, a second electrode of said principle electrically conducting channel connected to an output terminal, and a control electrode connected to said node.

19. The battery capacity indicating device of claim 17, further comprised of said display unit comprising a plurality of seven-segment LED modules for providing said variable visual display of the charge capacity of the battery in different discrete voltage levels from one to six volts.

20. The battery capacity indicating device of claim 18, further comprised of said display unit comprising a plurality of seven-segment LED modules for providing said variable visual display of the charge capacity of the battery in different discrete voltage levels from one to six volts.

* * * * *